United States Patent [19]
Joo et al.

[11] Patent Number: 5,817,532
[45] Date of Patent: Oct. 6, 1998

[54] FERROELECTRIC THIN FILM DEVICE AND METHOD FOR MAKING THE SAME

[75] Inventors: Seungki Joo, Sampoong Apt 22-201, San 192-3, Seocho-dong, Seocho-gu; Jaehyun Joo, both of Seoul, Rep. of Korea

[73] Assignee: Seungki Joo, Seoul, Rep. of Korea

[21] Appl. No.: 639,675

[22] Filed: Apr. 29, 1996

[30] Foreign Application Priority Data

Apr. 29, 1995 [KR] Rep. of Korea ............... 1995-10410

[51] Int. Cl.⁶ .................................................. H10L 21/00
[52] U.S. Cl. ............................................. 438/3; 438/240
[58] Field of Search .................... 437/47, 48, 52, 437/60, 919, 201; 257/295; 438/3, 240, 253, 396

[56] References Cited

U.S. PATENT DOCUMENTS

5,374,578  12/1994  Patel et al. ................................ 437/52
5,391,393  2/1995   Maniar ..................................... 427/100
5,578,846  11/1996  Evans, Jr. et al. ....................... 257/295
5,583,068  12/1996  Jones, Jr. et al. ......................... 437/52

*Primary Examiner*—Jey Tsai
*Assistant Examiner*—Joni Y. Chang
*Attorney, Agent, or Firm*—McDermott, Will & Emery

[57] ABSTRACT

There are disclosed a ferroelectric thin film device and a method for making the same. The ferroelectric thin film device includes a bottom electrode formed on a substrate, a ferroelectric thin film formed on the bottom electrode to contain a predetermined amount of Ta and have grains arranged in a regularly repeating pattern, and a top electrode formed on the ferroelectric thin film. The method for making a ferroelectric thin film includes the steps of forming a bottom electrode on a substrate, forming on the bottom electrode a Ta doped ferroelectric thin film, forming a top electrode on the ferroelectric thin film at regular intervals, and performing a rapid thermal annealing process on the ferroelectric thin film, using a radiant heating device, to induce crystallization.

9 Claims, 8 Drawing Sheets

FIG.10

FERROELECTRIC THIN FILM DEVICE AND METHOD FOR MAKING THE SAME

FIELD OF THE INVENTION

1. Background of the Invention

The present invention relates to a ferroelectric thin film device and a method for making the same. More particularly, it relates to such a ferroelectric thin film device and a method for making the same that has a ferroelectric thin film with large-sized grains whose nucleation site is artificially controlled to preclude deterioration such as fatigue and aging phenomena and to maximize productivity.

2. Description of the Prior Art

A ferroelectric material with perovskite structure has been used in various devices because of its excellent piezoelectricity, superconductivity and ferroelectricity. Many researches have been recently devoted to the formation of lead zirconate titanate (PZT) and $BaxSr_{1-x}TiO_3$ (BST) thin films for the application to semiconductor memory devices such as ferroelectric random access memory (FRAM) or dynamic random access memory (DRAM), using their high dielectric constants and large remnant polarization values. These devices, however, are subject to restrictions on electronic applications due to fatigue which is the decrease of electrical quality as a result of repeating access, aging which is the change in the characteristics of a device with passage of time, and high leakage current.

There have been efforts to prevent degradation due to fatigue, aging phenomena and the like by replacing presently available Pt metal electrodes with $RuO_2$ oxide electrodes. However, this approach inevitably causes high leakage current.

SUMMARY OF THE INVENTION

Accordingly, the present invention is made in an effort to solve the above-mentioned problems that are an obstacle to electronic applications. The present invention has a basic conception in which low reliability and high leakage current problems result from the existence of grain boundaries, and the manufacture of a single-grained ferroelectric thin film device is available by forming a grain of a ferroelectric thin film to be as large as possible and then by forming electronic devices in the individual grains.

It is an object of the present invention to provide a ferroelectric thin film device and a method for making the same that can minimize leakage current and degradation due to the fatigue and aging, and ensures excellent dielectric characteristics at different frequencies and the enhancement in productivity.

The object of the present invention can be achieved by employing a method for fabricating a ferroelectric thin film device comprising the steps of forming a bottom electrode on a substrate, forming a Ta doped ferroelectric thin film on the bottom electrode, forming a top electrode on the ferroelectric thin film at regular intervals, and performing a rapid thermal annealing process on the ferroelectric thin film, using a radiant heating device, to induce crystallization.

As another aspect of the present invention, a ferroelectric thin film device includes a bottom electrode formed on a substrate, a ferroelectric thin film formed on the bottom electrode to contain a predetermined amount of Ta and have grains arranged in a regularly repeating pattern, and a top electrode formed on the ferroelectric thin film.

DETAILED DESCRIPTION OF THE INVENTION

The present invention will be described in detail with reference to the accompanying drawings.

Tantalum (Ta) content for the inventive ferroelectric thin film is preferably in the range of 0.5 to 4.0 at%. When the amount of Ta doped in the ferroelectric thin film is less than 0.5 at%, a large-sized grain cannot be obtained, and when the Ta content exceeds 4.0 at%, there is no further change in the grain size with addition of Ta.

Figure 1A:
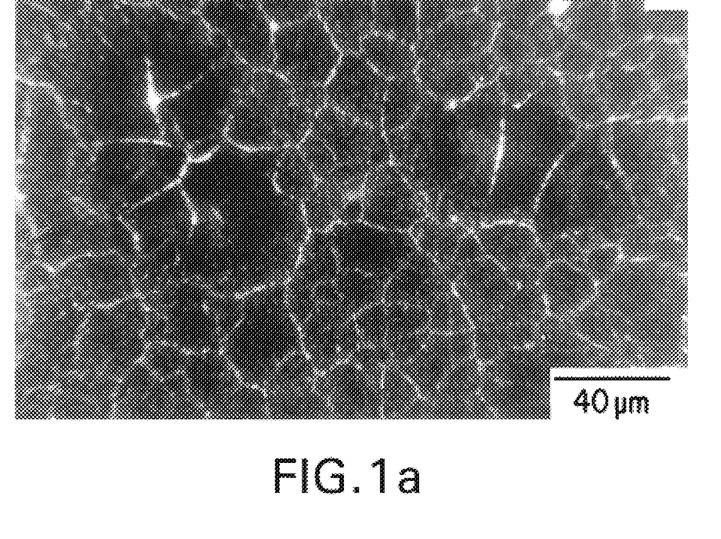
FIG. 1A and 1B are optical micrographs of Ta-undoped PZT thin film and Ta-doped PZT thin film formed by a rapid thermal annealing method.
Figure 1B:
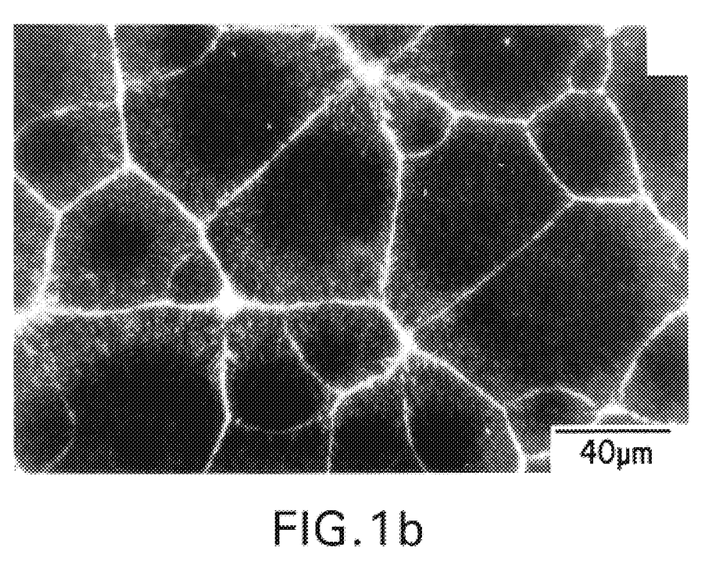

FIG. 1A and 1B are optical micrographs showing a lead zirconate titanate (PZT) thin film formed on a $Pt/SiO_2/Si$ substrate by sputtering using Pb, Zr—Ti and Ta metallic targets in oxygen and argon ambient and then treated by a rapid thermal annealing technique (RTA) for 30 minutes at a temperature of 750° C. FIG. 1A shows a PZT thin film that does not contain Ta, and FIG. 1B is a PZT thin film to which Ta of 2.9 at% is doped.

As shown in the drawing, the addition of Ta to the PZT thin film allows its grain size to be increased about 3 or 4 times. That is because the addition of Ta to the PZT thin film causes the decrease in the nucleation rate and the significant increase in the nuclear grain growth rate.

In order to obtain a ferroelectric thin film with perovskite structure having polarization characteristics, it is necessary to either deposit a thin film on a substrate or perform a proper post-annealing process, using rapid thermal annealing device, after completing the deposition step.

Perovskite structure that a PZT film has, includes seeds irregularly arranged in a matrix array with amorphous or pyrochlore phase. These seeds are grown to be in a rosette pattern. These rosettes meet each to form grain boundaries between the individual grains. The grain boundary has a low Schottky barrier to serve as a main passage of electron mobility. Since electric fields tend to concentrate therein, the dielectric breakdown easily occurs even at a low voltage level.

These grain boundaries can be suppressed by controlling a phase transformation. A ferroelectric thin film without a seed is grown to be in an irregular pattern of "rosettes" all over the thin film to form single grains arranged in an irregular pattern. On the contrary, proper control of the nucleation sites can make a ferroelectric thin film have single grains arranged in a regular pattern. Forming electric components inside these single grains prevents degradation to electrical characteristics of a ferroelectric device that may occur by the grain boundaries, and enhances productivity as well.

Figure 2:
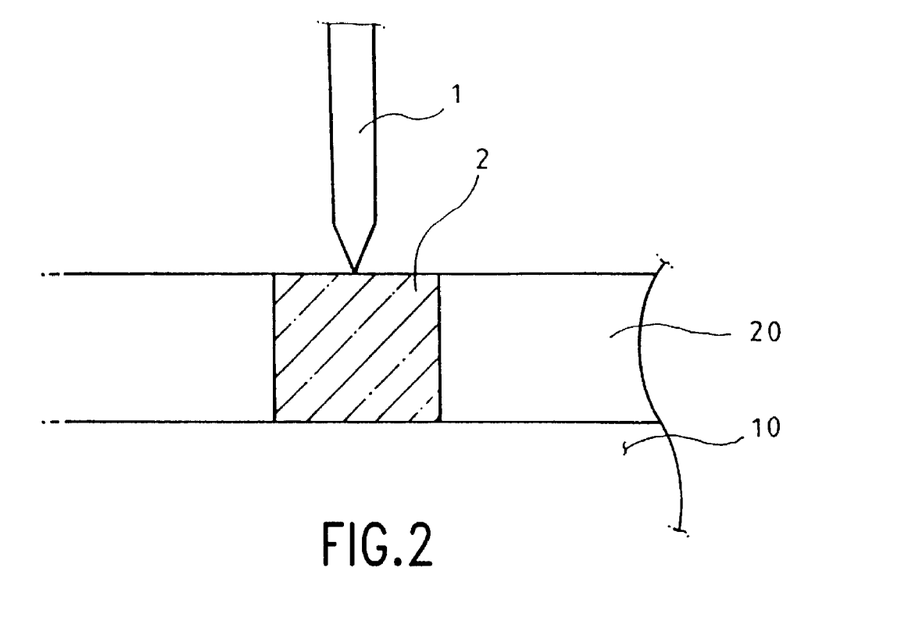
FIG. 2 depicts a schematic view of controlling the nucleation site of a grain by applying stress to a ferroelectric thin film by means of a microprobe.
Figure 3:
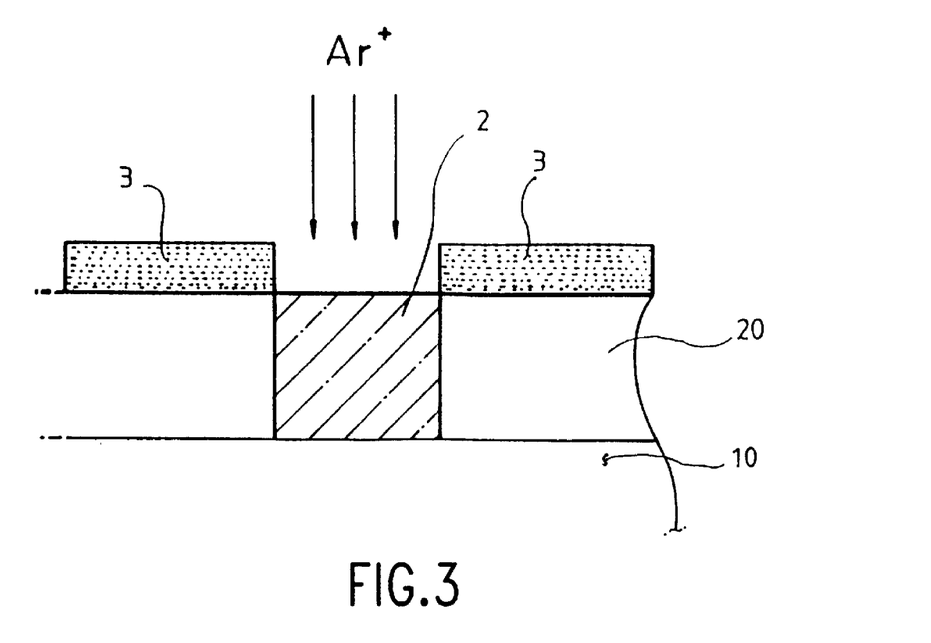
FIG. 3 depicts a schematic view of setting the nucleation site of a grain by implanting Ar ions into a ferroelectric thin film by ion implantation or ion mass doping systems.

The nucleation site of a grain can be properly controlled in a ferroelectric thin film either by applying stress directly to a ferroelectric thin film 20 deposited onto a substrate 10 by means of a microprobe 1 as shown in FIG. 2, or by making Ar, $O_2$, or $N_2$ ions strike the surface of a ferroelectric thin film 20, using a mask 3 formed on the thin film 20 through a photolithographic process to form a seed site 2, as shown in FIG. 3.

Figure 4:
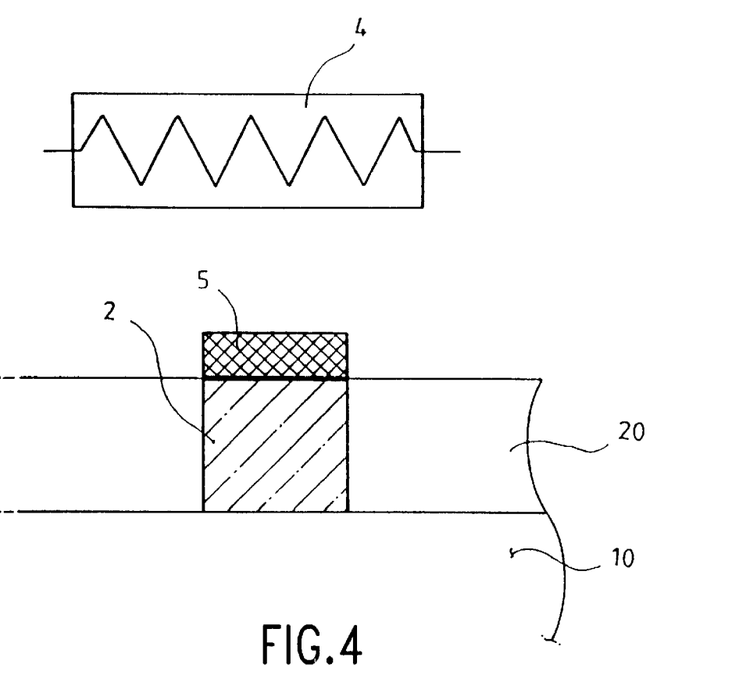
FIG. 4 depicts a schematic view of controlling the nucleation site of a grain by radiant heating by means of a halogen lamp.

FIG. 4 depicts a schematic view of controlling the nucleation site of a grain by radiant heating by means of a halogen lamp.

According to this scheme, a metallic thin film 5 made from an electrode material such as Pt is formed just on a predetermined area over a ferroelectric thin film 20 by a photolithographic process, and only the area where the metallic thin film 5 is formed is raised in temperature by rapid thermal annealing by means of a radiant heater 4 to become a nucleation site thereby.

Figure 5:
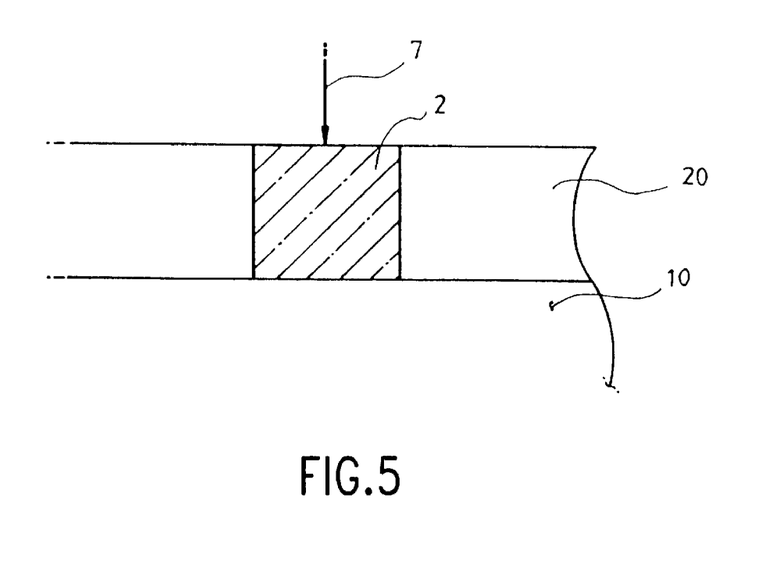
FIG. 5 depicts a schematic view of controlling the nucleation site of a grain by selective exposure of a laser beam.

Referring now to FIG. 5, the nucleation site of a grain can be controlled by applying a laser beam 7 by means of a small-spot laser just to a area where a seed is to be formed. Only the area to which the laser beam 7 is applied has a temperature higher than that of the other areas to be a nucleation site thereby.

Figure 6:
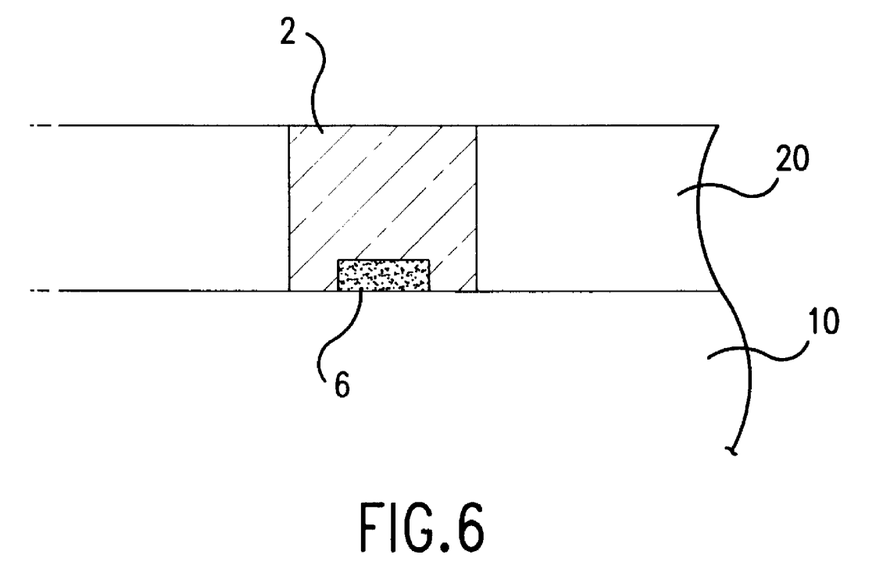
FIG. 6 depicts a schematic view of setting the nucleation site of a grain by locally depositing a seed material onto a substrate.

FIG. 6 depicts a schematic view of artificially forming the nucleation site of a grain on a substrate 10. A seed material 6 is deposited onto a predetermined area of the substrate 10 by a photolithographic process, and a ferroelectric thin film 20 is formed thereon. A seed material 6 to be deposited on an artificial nucleation site may be selected from the group of PbOx, TiOx, $PhTiO_3$ and $PbZrO_3$. A ferroelectric material having the same constitution as that of the ferroelectric thin film is adequate to serve as a seed material. Preferably, a PZT material is a perovskite-phase one thermally treated, rather than amorphous or pyrochlore phase.

The following description relates to the steps in the manufacture of a PZT thin film.

Metallic targets of Pb, [Zr, Ti] and Ta are provided to a co-sputtering machine, and the high voltage respectively applied to the targets causes depositing on a $Pt/SiO_2/Si$ layer 10 to form a PZT thin film containing Ta to a thickness of 3000 Å, according to the sputtering conditions in Table.

In order to form a perovskite structure with a rosette pattern on a desired area, Pt top electrodes 5 of 10 $\mu$m×10 $\mu$m in size are formed on the PZT thin film at intervals of 50 $\mu$m, and a rapid thermal annealing process is carried out for 2 minutes at a temperature of 700° C., by a radiant heater using a halogen lamp 4, which is shown in FIG. 4.

Figure 7:
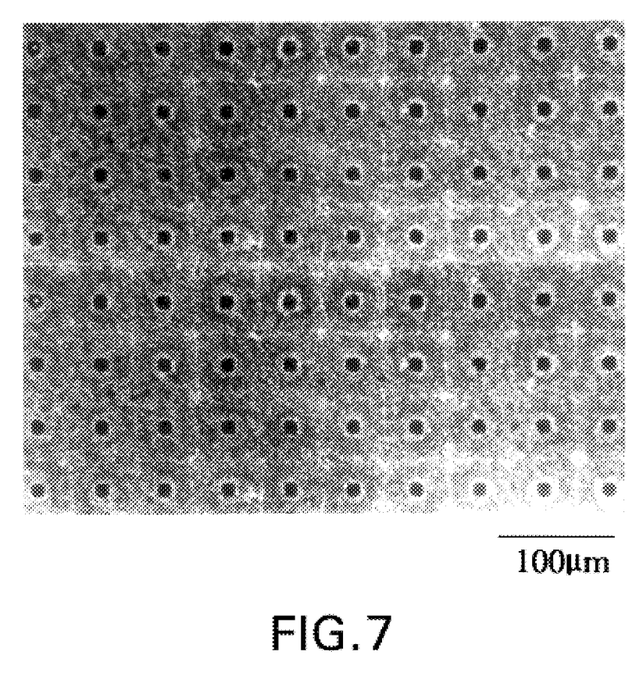
FIG. 7 is an optical micrograph of a PZT thin film in which single grains grown to be arranged in a regular pattern, centering around the seed site artificially controlled in accordance with the present invention.
Figure 8:
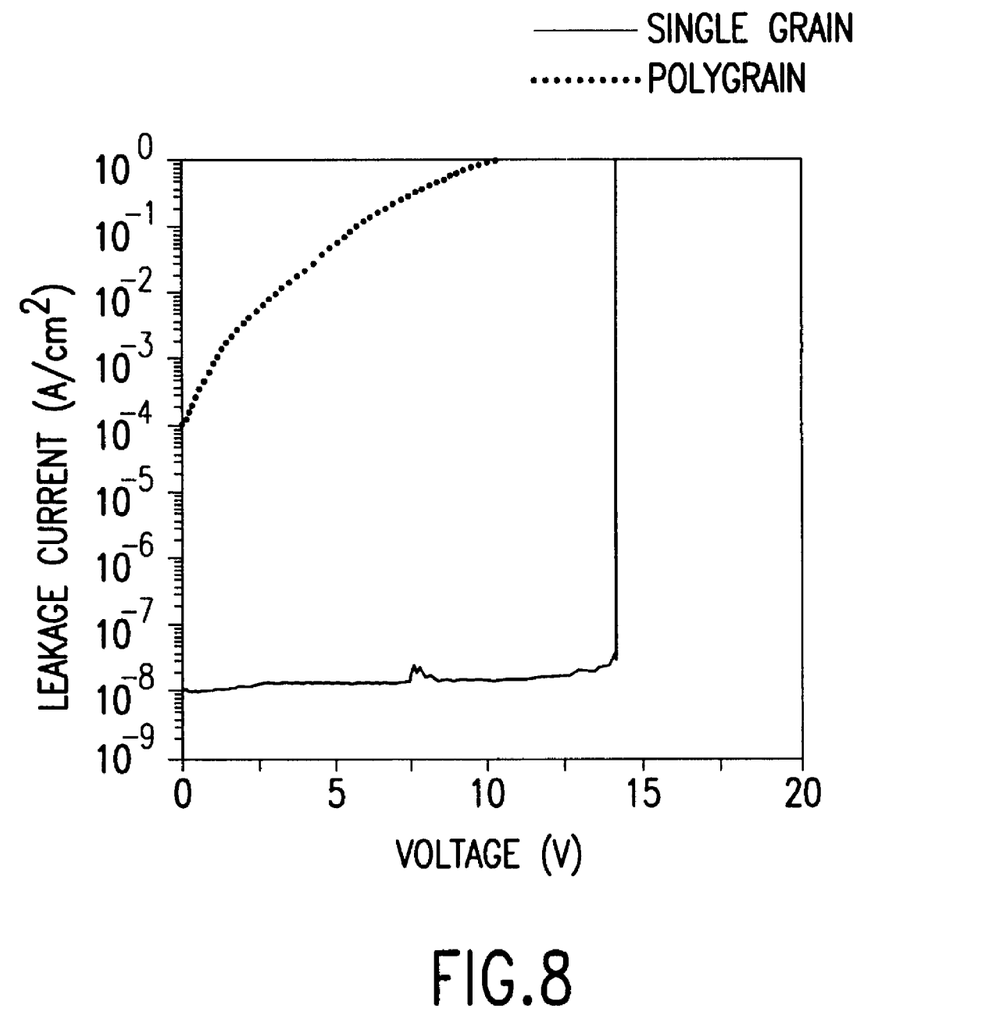
FIG. 8 is a graph comparing the current-voltage characteristics of the inventive single-grained PZT thin film against the current-voltage characteristics of a conventional poly-grained PZT one.
Figure 9A:
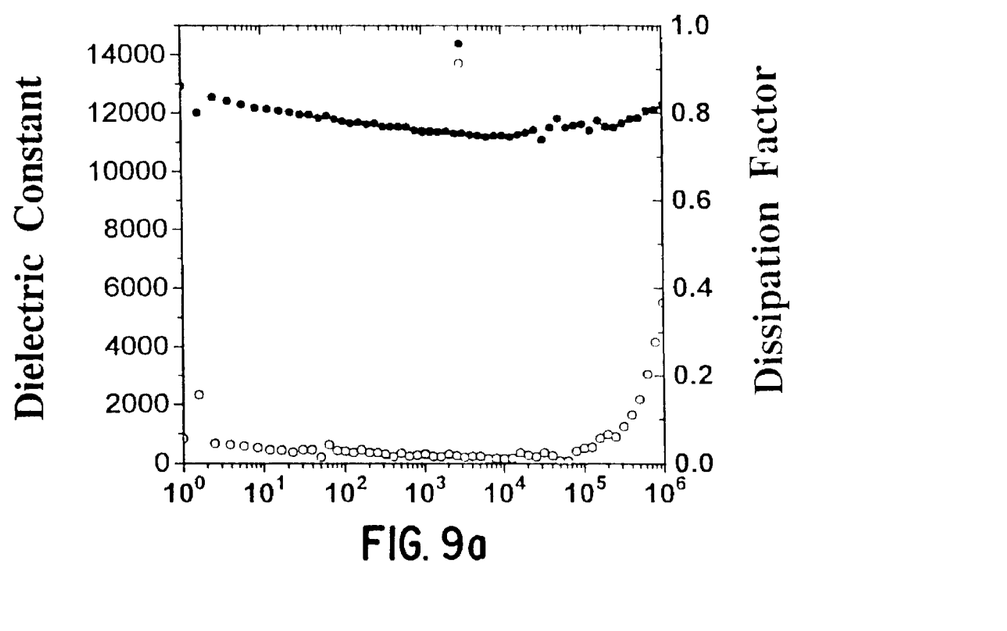
FIG. 9A and 9B are graphs comparing the dielectric constant-frequency characteristics of the inventive single-grained PZT thin film against the dielectric constant-frequency characteristics of the conventional poly-grained PZT one.
Figure 9B:
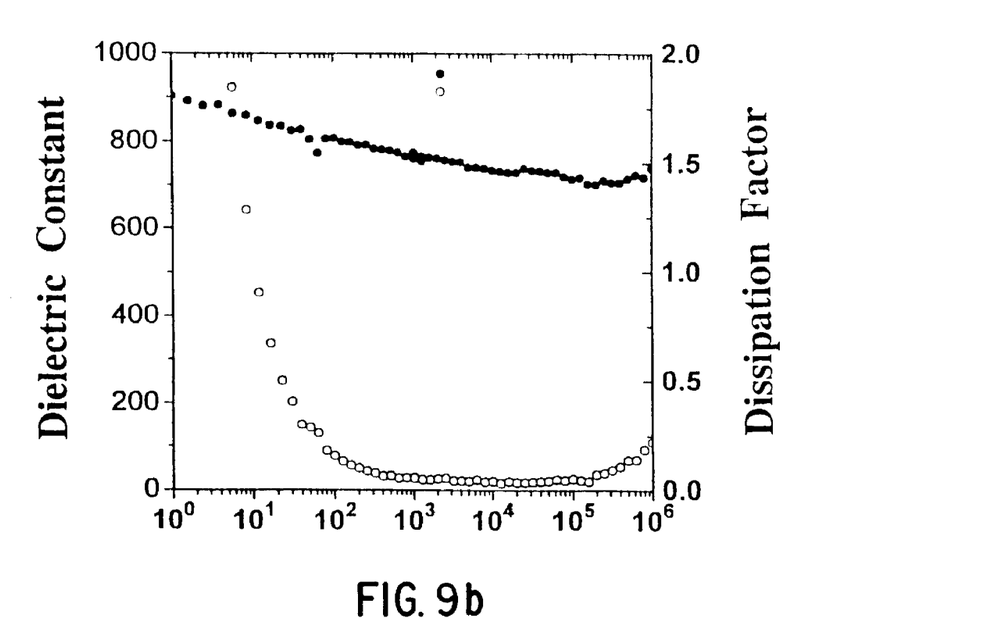
Figure 10:
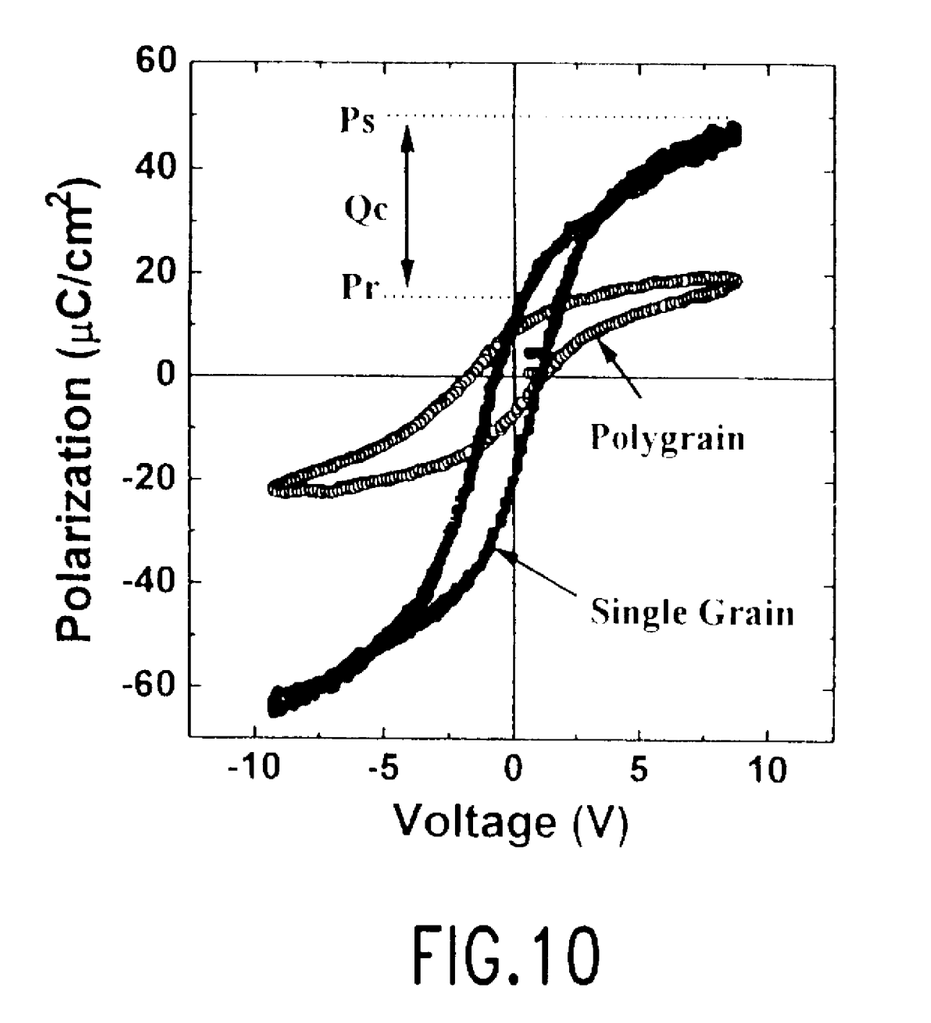
FIG. 10 is a graph comparing the polarization-voltage characteristics of the inventive single-grained PZT thin film against the polarization-voltage characteristics of a conventional poly-grained PZT one.

The microscopic structure of the PZT thin film fabricated in such a manner is shown in FIG. 7. The single grained PZT film's ferroelectricity and piezoelectricity are analyzed at room temperatures by means of HP4140B pA meter, IM5d Impedance analyzer, and Sawyer -Tower circuit, which is illustrated in FIGS. 8, 9 and 10 in comparison with the characteristics of a poly-grained PZT thin film.

TABLE

| Sputtering Conditions of Ta-Doped PZT Thin Film | |
|---|---|
| Substrate | Pt (1000Å)/SiO$_2$ (5000Å)/Si |
| Substrate Temperature | 350° C. |
| Gas Flow | Ar (2 sccm) + O$_2$ (18 sccm) |
| Pressure | 20 mtorr |
| Power    Pb | DC 320V |
| [Zr, Ti] | RF 300W |
| Ta | DC 0V or 280V |

As shown in FIG. 7, the PZT thin film of the present invention is crystallized to form perovskite-phase single grains that are arranged in a regular pattern in which square shaped rosettes are formed centering on Pt dots, nucleation sites artificially set.

FIG. 8 is a graph comparing the leakage current-voltage characteristics of the inventive single-grained PZT thin film against the current-voltage characteristics of a conventional poly-grained PZT one.

As the applied voltage increases, the poly-grained PZT thin film has increased leakage current. The single-grained PZT thin film has leakage current of less than $1 \times 10^{-8}$ A/cm$^2$, and dielectric breakdown occurs abruptly at about 500 kV/cm.

FIG. 9A and 9B are graphs comparing the dielectric constant-frequency characteristics of the inventive single-grained PZT thin film against the dielectric constant-frequency characteristics of the conventional poly-grained PZT one. As shown in the graphs, a poly-grained PZT thin film device has a dielectric constant of about 800, and the inventive single-grained PZT thin film device has a dielectric constant of about 12,000 that is considerably higher than that of presently available PZT thin film devices.

FIG. 10 is a graph comparing the polarization-voltage characteristics of the inventive single-grained PZT thin film against the polarization-voltage characteristics of a conventional poly-grained PZT one. The single-grained PZT thin film device has a remnant polarization value (Pr) larger than that of the poly-grained PZT thin film, and is also higher than that of poly-grained PZT in effective charge density (Qc) that is indicative of the difference between saturation polarization values and remnant polarization values (Pr). Thus, the inventive single-grained PZT thin film may have particular utility in ferroelectric RAM and DRAM devices.

According to the present invention, after forming a ferroelectric thin film containing Ta on a substrate, the nucleation site of each grain is controlled in the thin film to obtain the thin film structure with large-sized grains arranged in a regular pattern. Accordingly, forming electronic devices in these grains may significantly decrease a leakage current, simultaneously with preventing deterioration to polarization characteristics caused by fatigue and aging phenomena, etc., which enables the formation of ferroelectric thin film device with high reliability. Further, the inventive ferroelectric thin film has a regular arrangement of single grains to maximize productivity.

The present invention takes a PZT material as an example of ferroelectric, and includes all the materials displaying ferroelectric characteristics of $ABO_3$. "A" includes Pb, Ba or Br, and "B" includes Zr, Ti, La or W. In addition, the present invention employs a sputtering technique as a method for fabricating a ferroelectric thin film, and may include all the methods for making a thin film, such as chemical vapor deposition, laser ablation, sol-gel technique, etc.

A ferroelectric device of the present invention includes a memory device, piezoelectric device, superconductive device and the like that utilizes ferroelectric characteristics.

Although several preferred embodiments of the present invention have been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A method for fabricating a ferroelectric thin film device comprising the steps of:

forming a bottom electrode on a substrate;

forming a tantalum (Ta) doped ferroelectric thin film on the bottom electrode;

forming a top electrode on the ferroelectric thin film at regular intervals; and thereafter performing a thermal process on the ferroelectric thin film to induce crystallization.

2. A method according to claim 1, wherein Ta added to the ferroelectric thin film has a content in the range of 0.5 atomic% to 4.0 atomic%.

3. A method according to claim 1, wherein said substrate is formed by forming insulating layer onto a substrate.

4. A method according to claim 1, wherein said top and bottom electrodes are formed by depositing Platinum (Pt).

5. A method according to claim 1, wherein said ferroelectric thin film is formed by performing a sputtering process forming a lead zirconate titanate thin film.

6. A method according to claim 1, wherein said top electrode is a Pt top electrode formed to have a size of 10 $\mu$m×10 $\mu$m at intervals of 50 $\mu$m on the lead zirconate titanate thin film.

7. A method for fabricating a ferroelectric thin film device comprising the steps of:

forming a bottom electrode on a substrate;

depositing a seed material on an area of the bottom electrode at intervals by a photolithographic technique;

forming a Ta doped ferroelectric thin film on the exposed bottom electrode and seed material; and performing a thermal process on the ferroelectric thin film to induce crystallization.

8. A method according to claim 7, wherein the step of performing a thermal process in the ferroelectric thin film is carried out after the step of forming a Ta doped ferroelectric thin film on the exposed bottom electrode and seed material.

9. A method for fabricating a lead zirconate titanate thin film device comprising the steps of:

forming a bottom electrode of Pt on a substrate made of silicon dioxide ($SiO_2$) and silicon (Si);

depositing a Ta-doped lead zirconate titanate thin film on said Pt bottom electrode;

depositing a top electrode of Pt on said Ta-doped lead zirconate titanate thin film at regular intervals; and thereafter performing a thermal process on the lead zirconate titanate thin film.

* * * * *